United States Patent [19]

Park et al.

[11] 4,398,426

[45] Aug. 16, 1983

[54] LINEAR CAPACITIVE PRESSURE TRANSDUCER SYSTEM

[75] Inventors: Kyong Park, Chatsworth, Calif.; Chen Y. Lee, Troy, Mich.

[73] Assignee: Kavlico Corporation, Chatsworth, Calif.

[21] Appl. No.: 279,938

[22] Filed: Jul. 2, 1981

[51] Int. Cl.³ .............................................. G01L 9/12
[52] U.S. Cl. ...................................... 73/724; 73/708; 73/718
[58] Field of Search ................. 73/724, 701, 718, 708, 73/753; 361/283; 328/1, 5; 307/118; 340/562

[56] References Cited

U.S. PATENT DOCUMENTS

| 4,227,419 | 10/1980 | Park ...................................... 73/724 |
| 4,250,452 | 2/1981 | Gray et al. .............................. 328/5 |
| 4,322,977 | 4/1982 | Sell et al. ............................... 73/708 |

*Primary Examiner*—Donald O. Woodiel
*Attorney, Agent, or Firm*—Poms, Smith, Lande & Rose

[57] ABSTRACT

A capacitive pressure transducer system includes a reference capacitor and a capacitor which varies with pressure; and circuitry which involves alternately charging one of the capacitors to a reference voltage level, and then switching to charge the other capacitor; and circuitry for producing an output voltage which varies as the duty cycles of the two capacitors shift; and the output is therefore substantially proportional to the pressure changes. Feedback is provided to incrementally change the capacitor charging and switching timing or duty cycles by changing the charging current or the reference voltage at which switching occurs, to substantially eliminate deviations from linearity in the voltage versus pressure characteristic.

10 Claims, 4 Drawing Figures

LINEAR CAPACITIVE PRESSURE TRANSDUCER SYSTEM

FIELD OF THE INVENTION

This invention relates to capacitive pressure transducers, and more particularly to such transducers having a highly linear output voltage versus pressure characteristic.

BACKGROUND OF THE INVENTION

Initially, attention is directed to U.S. Pat. No. 4,227,419, granted Oct. 14, 1980, inventor: Kyong Park, title: "Capacitive Pressure Transducer," with the patent being assigned to the assignee of the present invention. As disclosed in the above-cited patent, capacitive pressure transducer systems may include a substantially fixed or slowly changing reference capacitor, and a variable capacitor including two closely spaced metal plates mounted in opposition to one another, with a sealed space between the conductive plates, and at least one of the plates mounted on a flexible diaphragm, so that as the pressure changes, the capacitance of this variable capacitor will change as the plates vary in their spacing. In the system as disclosed in the above patent, a bistable multivibrator, or flip-flop, is actuated in response to the charging first of the reference capacitor and secondly of the variable capacitor, with the time in each of the two states of the multi-vibrator being controlled by the time required for the charging of the reference capacitor and the variable capacitor, respectively. The square wave type output from the multivibrator is detected and integrated so that the output voltage increases as the capacitance of the variable capacitor increases, with increased pressure.

Incidentally, the linearity of these pressure transducer systems of the type shown in the above-cited patent is relatively good, but in the absence of compensation, a slight curvature or departure from linearity over a broad pressure range has been observed.

A principal object of the present invention is to improve the linearity, or the output voltage versus pressure characteristic of capacitive pressure transducer systems of the type discussed hereinabove.

SUMMARY OF THE INVENTION

In accordance with the present invention, feedback may be provided from the electronic circuitry by which the output voltage is developed, either to incrementally change the level of charging current, or to incrementally vary the switching reference level of the capacitor circuitry, in order to reduce the departures from linearity mentioned hereinabove.

Thus, by way of one specific example, if the output characteristic has a slight upward or convex curvature in the voltage versus pressure characteristic, a resistive feedback path may be connected from the output to assist in the charging of the reference capacitor. Mathematical analysis reveals that the incremental function provided by this feedback path is exponential, involving the square root of the ratio of the capacitance of the reference capacitor divided by that of the variable capacitor; and accordingly, by using the proper polarity and the proper magnitude of the feedback resistor, the curved exponential characteristic may be employed to compensate for the slight oppositely curved characteristic of the uncompensated output voltage.

Similarly, with a resistive feedback circuit connected from the output circuitry to the reference voltage point for the comparator circuits associated with either of the two capacitors being charged, a voltage factor having a continuous curvature will be produced. By choosing the proper polarity and magnitude of the feedback resistor, correction for the linearity may again be obtained.

The present correction circuitry involves initially a recognition of the continuous curvature of the output characteristic, and analysis of the contribution to the output voltage which will be produced by resistive feedback networks, and a determination that the continuous curvature of these output voltage contributions may be offset against the basic deviations from linearity of the uncompensated characteristic, so that a linear output may be produced through the utilization of a simple resistive feedback circuit.

Other objects, features, and advantages of the invention will become apparent from a consideration of the following detailed description and from the accompanying drawings.

DETAILED DESCRIPTION

Figure 1:
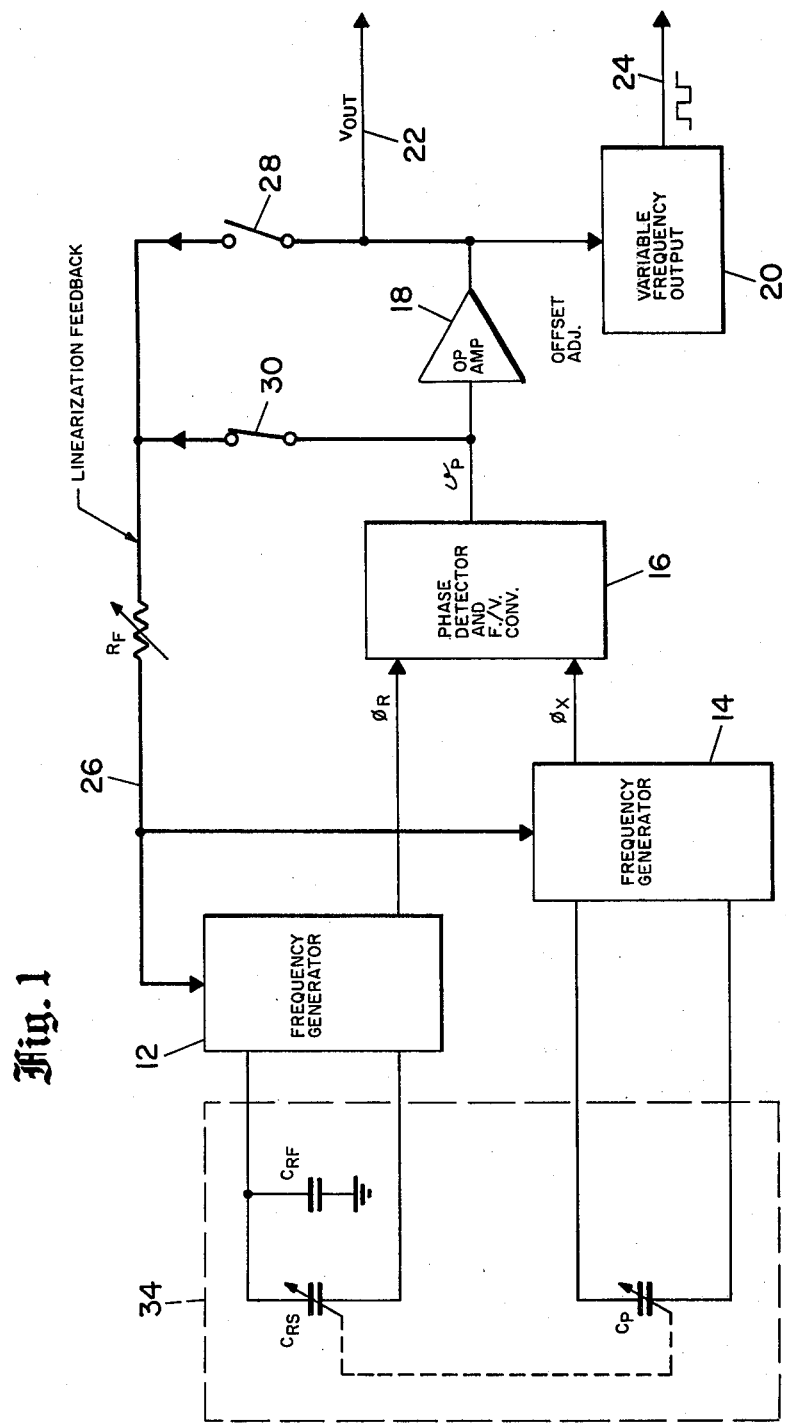
FIG. 1 is a schematic block diagram indicating the principles of the present invention.
Figure 2:
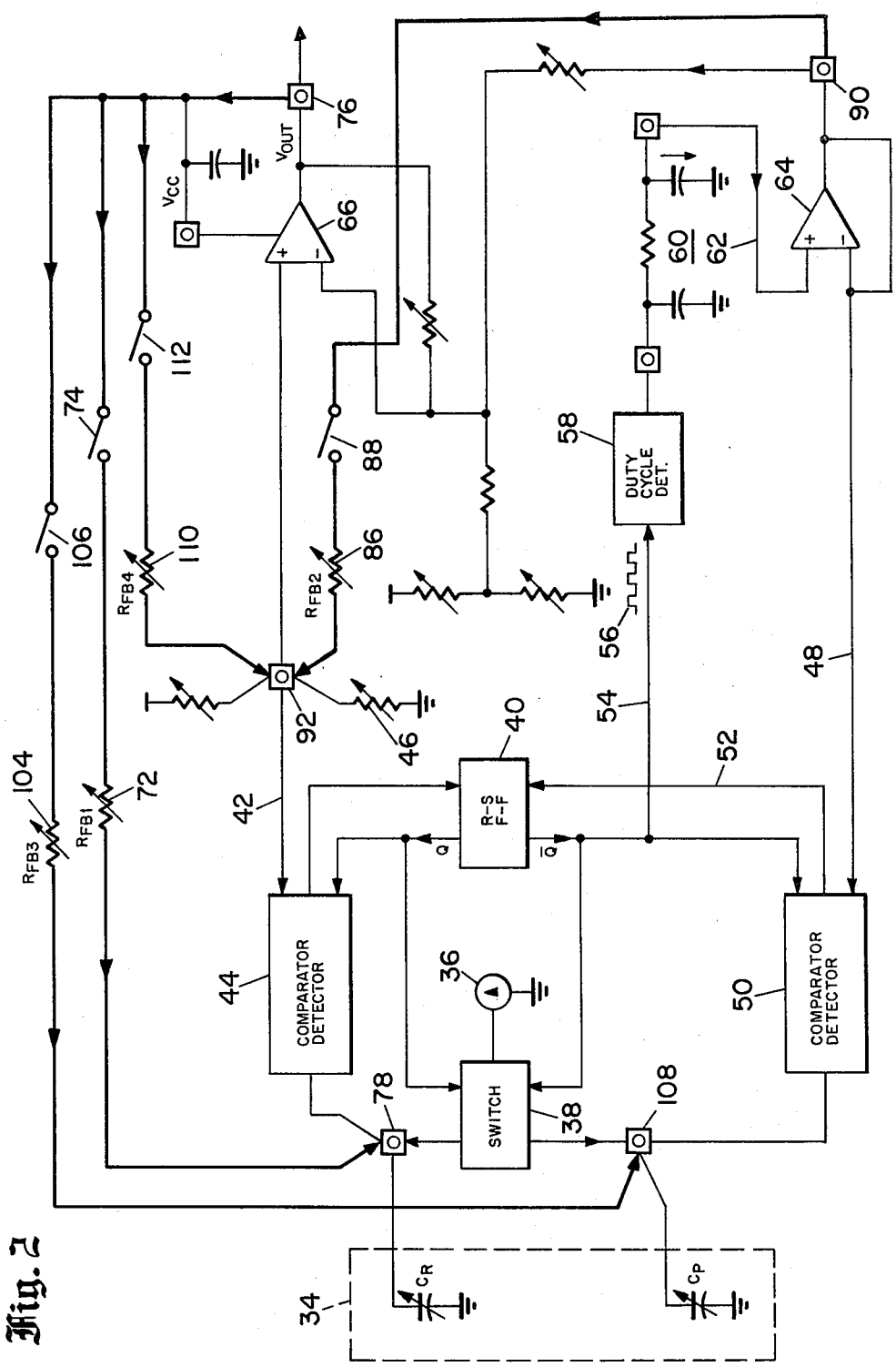
FIG. 2 is a more detailed circuit diagram showing various feedback paths for system linearization, in accordance with the invention.
Figure 4:
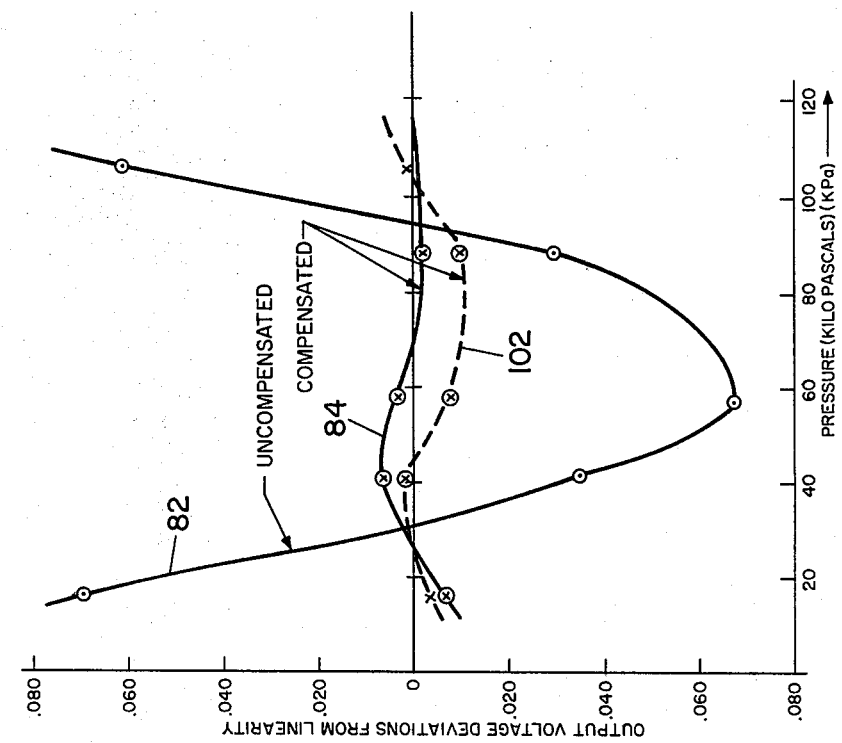
FIG. 4 is a set of plots comparing deviations from linearity for an uncompensated capacitive pressure transducer system with various compensated transducer systems.

With reference to the drawings, it may initially be noted that FIGS. 1 and 2 of the drawings are similar to FIGS. 4 and 8 respectively, of the drawings of the prior U.S. Pat. No. 4,227,419, assigned to the assignee of this invention, and cited hereinabove.

More specifically, as shown in FIG. 1 of the drawings, the capacitor C-P represents the pressure variable capacitor which changes its capacitance significantly with changes in pressure. This capacitor may, for example, be of the type shown in the above-cited U.S. Pat. No. 4,227,419. The reference capacitor, which is shown in FIG. 1 as the parallel combination of C-RS and C-RE (and in FIG. 2 as a single capacitor C-R) is fixed or changes by a relatively small amount as compared with the changes of C-P, with variations in pressure. In practice, the reference capacitor may be mounted in the same structure with the capacitance C-P, but in a location where variations in pressure do not significantly change the capacitance of this reference capacitor. Accordingly, for example, the reference capacitor may be implemented by spaced opposed conductive coatings which are mounted on the same structure as the variable capacitor C-P but in a location at the periphery, or beyond the normal periphery of the diaphragm upon which a conductive coating forming a part of the viariable capacitance is mounted.

Incidentially for convenience in printing and word-processing, certain components, such as the pressure variable capacitor C-P, are designated with a dash between the "C" and the "P" instead of using the "P" as a subscript.

Also shown schematically in FIG. 1 is a frequency generator 12 associated with the reference capacitor or capacitors, a frequency generator 14, a phase detector and frequency-to-voltage converter 16, an operational amplifier 18 and a circuit 20 for converting the variable output voltage on lead 22 to a signal on lead 24 which varies in frequency. The resistive feedback circuit 26 including variable resistor R-F is shown schematically in FIG. 1 as being coupled with one polarity through switch 28 or with the other polarity from the other side of the reversing amplifier 18, through the switch 30. As will be shown in greater detail in connection with FIG. 2, the feedback circuit may be employed to vary the charging current for one of the capacitors, or to change the reference levels at which one of the capacitor circuits initiates a switching action.

Incidentally, in both FIGS. 1 and 2, the dashed line block 34 indicates that the reference capacitor and the pressure variable capacitor are both mounted in a single location or on a single substrate, with the purpose being to avoid the tedious process of matching ratios of C-R to C-P externally and also to avoid deviations in capacitance as a result of thermal changes.

In FIG. 2, a current source 36 supplied charging current either to the variable capacitor C-P or the reference capacitor C-R under the control of switch 38. The switch 38 is operated under the control of the flip-flop or bistable multi-vibrator 40. Assuming that the reference capacitor C-R is being charged, when it reaches a predetermined voltage level as provided on input lead 42 to the comparator/detector 44, a signal is transmitted on lead 46 to change the state of the flip-flop 40. This in turn changes the state of the switch 38 so that the current from the current source 36 is routed to charge the pressure variable capacitor C-P instead of the reference capacitor C-R. When the variable capacitor C-P is charged to a predetermined reference level as determined at lead 48 to the comparator/detector 50, an output signal is supplied on lead 52 to the flip-flop 40 to change its state. This action in turn reverses the state of the switch 38 and current is then routed to charge the reference capacitor C-R once more.

Figure 3:
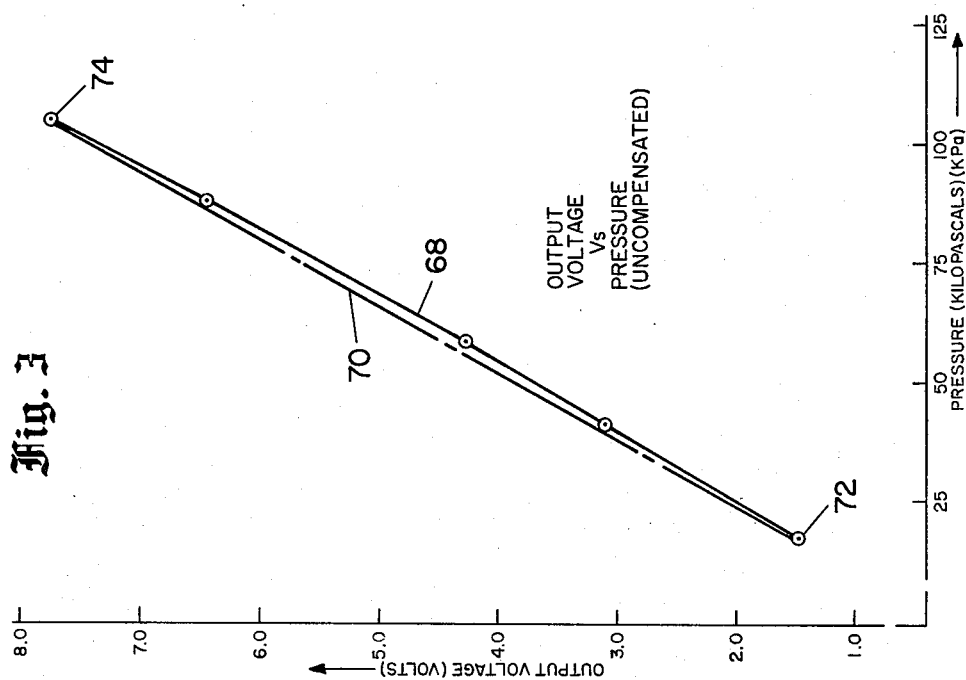
FIG. 3 is a plot of the output voltage versus pressure characteristic of an uncompensated capacitive pressure transducer system.

The output from the flip-flop 40 on lead 54 appears in square or rectangular wave form as shown at 56, but the length or duration of the positive and negative pulses included in the pulse trail will depend on the capacitance of C-P and C-R. More specifically, as the pressure increases and the capacitance of the variable capacitor C-P increases, it will take longer to charge up to the reference voltage level, and the portion of the cycle of flip-flop 40 which is dependant on the charging of the variable capacitor C-P will be prolonged, in order for the voltage on C-P to reach the previously preset value. Lead 54 routes the output from flip-flop 40 to the duty cycle detector 58, from which it is converted into a slowly varying direct current level by the integration circuit 60. As a result, the signal on lead 62 to the operational amplifier 64 varies in amplitude with the variation in capacitance of C-P. Accordingly, the output from the final operational amplifier 66 is a positive voltage which varies substantially linearly with changes in pressure, as indicated by the curved characteristic 68 as shown in FIG. 3. This characteristic 68 curves somewhat upwardly, and this curvature may be more clearly seen by reference to the straight dashed line 70 which has been drawn between points 72 and 74 on the voltage versus pressure characteristic 68 of FIG. 3. Although this departure from linearity is relatively small, for high precision application it is significantly greater than would be desirable, and the feedback circuitry to be described hereinbelow compensates for this departure in linearity to a substantial extent.

Now, turning to the feedback circuits which may be employed, the first one to be considered includes the feedback resistor 72 which may be connected by the switch 74 between the output terminal 76 and terminal 78, so that it charges the reference capacitor C-R in parallel with the current flowing from the source 36 through the switch 38.

In the absence of the feedback resistor 72, the mathematical expression for the output voltage $V_o$ is set forth below in equation (1), which is a slight simplification of equation 1 which appears in column 4, of the above-cited U.S. Pat. No. 4,227,419:

$$V_o = f[b_1 V_{cc} - b_2(C_r/C_p)V_{cc}] \qquad (1)$$

In the foregoing equation (1), $b_1$ and $b_2$ are constants, and $V_{cc}$ is the supply voltage to the circuit.

Equation (1) may be written in slightly modified form as follows:

$$V_o = f(b_1 V_{cc} - b_2(C_r/C_p)(I_p/I_R)V_{cc}) \qquad (2)$$

Where $I_p$ and $I_R$ are the charging currents for the variable capacitor C-P and C-R respectively.

When feedback resistor 72, also designated $R_{FB1}$ is placed from the output to assist in charging the reference capacitor C-R, then the current $I_R$ will be given by the following expression:

$$I_R = \frac{V_o - \frac{b_2}{2} V_{cc}}{R_f} + I_p \qquad (3)$$

Where the resistance of the feedback resistor if $R_f$.

When equation (3) is added to equation (2) and we solve for $V_o$, the transfer equation indicating the contribution produced by the additional feedback current is in the following form:

$$V_o = [(\text{Constant}, R_F, C_R/C_p)^{\frac{1}{2}}] \qquad (4)$$

Now, equation (4) is an exponential and involves the square root of the ratio of the reference capacitor to the pressure variable capacitor. A square root function has a downward curvature relative to a straight line, as compared with the slight upward curvature as shown in FIG. 3 for the uncompensated characteristic. Accordingly, a combination of Equation (4) and Equation (2) will give a substantially straight line characteristic, if the value of the feedback resistor $R_{FB1}$ (FIG. 2) is chosen to have the proper value to produce the proper amount of compensating current. This is indicated in FIG. 2 of the drawings by the variable feedback resistor 72, although in practice a number of feedback resistors were employed, and the proper value of resistance for linearization was selected. Using a variable capacitor in which the capacitance changed by 15 or 20 picofarads in the range of 60 to 90 picofarads, a comparable reference capacitor and an integrated circuit chip such as Motorola chip Part No. CCF 7416, it was found that a feedback resistance in the order of 4 megohms provided significantly improved linearization.

FIG. 4 shows in plot 82, the departures from linearity or departures from a "best fit" straight line, by the characteristic 82 for the uncompensated transducer. However, following compensation by addition of the resistor 72, the greatly reduced departures from linearity are indicated by the characteristic 84.

On the percentage basis, the linearity error of the uncompensated characteristic was 1.094%, as compared with an error of 0.076% for characteristic 84. Note that this is a dramatic improvement in linearity by more than an order of magnitude, or an improvement in linearity by a factor of more than 15.

An alternative feedback path including the resistor 86 and the switch 88 extends from the terminal 90 at the output of the operational amplifier 64 to the termanal 92 providing the reference input voltage to the lead 42 connected to the comparitor detector 44. Incidentally, it may be noted that there is a polarity reversal between the output from the operational amplifier 64 and from the operational amplifier 66. Accordingly, when it is desired to have feedback of one polarity, terminal 90 may be employed, while for the other polarity terminal 76 may be used. Alternatively, a separate inverting amplifier may be connected to terminal 90, to avoid any possible interaction between the feedback circuit and the output circuit, and these are considered to be substantial equivalents of one another under normal circuit conditions.

Now, proceeding to a consideration of the effect of feedback through resistor 86, mathematical analysis reveals that the resulting equation is in the following form:

$$V_{out} = f\left[ b_1 V_{cc} - b_2\left(\frac{C_R}{C_p}\right)\left(1 + \frac{C_R}{C_p} \frac{b_3}{R_F} - \frac{b_3}{R_F} + --\right) V_{cc} \right] \quad (5)$$

In reviewing this equation, it may be noted that with the feedback resistor $R_{FB2}$ not present, or the resistance equal to infinity, the terms with $R_{FB2}$ in the denominator will drop out and the equation will revert to the form shown in equation (1). However, with $R_{FB2}$ having a finite value, the term will include the square of the reciprocal of the pressure variable capacitor and will therefore have a convex characteristic, if positive feedback from the output terminal 76 were employed. By feeding back from terminal 90, which is of inverted polarity relative to terminal 76, a downwardly curved component is introduced, and correction is again obtained.

With regard to the magnitude of the correction, as an example, using a 5 kilohm resistor for feedback resistor 86, the correction characteristic 102 as shown in FIG. 4 was obtained. The maximum departure from linearity was calculated to be 0.163%. This is of course approximately 6.7 times better than the maximum departure from linearity of 1.094% for the uncompensated system.

As a matter of completeness, Table I and Table II are set forth below to show output voltage readings at various pressure levels, using a fixed reference capacitor and a diaphram-type pressure variable capacitor of the type shown in our prior patent cited hereinabove, but without the small variable secondary capacitor. Table I relates to the current feedback arrangements involving resistor 72, while Table II relates to the voltage feedback circuit utilizing feedback resistor 86. In addition, below the actual voltages in certain cases are included, within parentheses, the voltage deviations from a "best fit" straight line.

TABLE I

Output Voltages Using Current Feedback Resistor 86

| R-F | Pressure ($KP_a$) | | | | |
|---|---|---|---|---|---|
| | 17 | 41 | 58 | 88 | 105 |
| No Comp. | 1.479 | 3.083 | 4.26 | 6.437 | 7.740 |
| | (+.070) | (−.035) | (−.068) | (−.029) | (+0.062) |
| 3 K-ohms | 1.373 | 3.100 | 4.274 | 6.283 | 7.394 |
| 4 K-ohms | 1.341 | 3.091 | 4.312 | 6.434 | 7.627 |
| 5 K-ohms | 1.438 | 3.107 | 4.281 | 6.351 | 7.527 |
| | (−0.005) | (+0.005) | (+0.003) | (−0.002) | (−0.001) |
| 6 K-ohms | 1.460 | 3.098 | 4.263 | 6.341 | 7.535 |

TABLE II

Output Voltage Using Voltage Feedback Resistor 72

| RF | Pressure ($KP_a$) | | | | |
|---|---|---|---|---|---|
| | 17 | 41 | 58 | 88 | 105 |
| 3 Megohms | 1.417 | 3.110 | 4.280 | 6.317 | 7.471 |
| 4 Megohms | 1.446 | 3.114 | 4.288 | 6.372 | 7.574 |
| | (−0.004) | (+0.002) | (−0.007) | (−0.009) | (+0.001) |
| 6 Megohms | 1.44 | 3.073 | 4.253 | 6.392 | 7.650 |

In the foregoing description, the use of feedback resistor 72 to provide current feedback to terminal 78 was discussed; and the use of resistor 86 to provide reference voltage level feedback changes to terminal 92 was also analyzed. In both cases, it was assumed that the uncompensated output characteristic had an upward curvature with pressure changes, and the feedback contribution was selected to have the desired downward curvature and magnitude to correct for this upward curvature.

Now, it is expected that certain types of pressure transducers could have an uncompensated curvature which would tend to curve downwardly from the linear rather than upwardly as in the case discussed hereinabove. For such cases a different form of compensation would be required, such as the use of feedback resistor 104 shown connected into the circuit by switch 106 from the output terminal 76 to terminal 108 to supply additional current to charge the variable capacitor C-P. Similarly, the supplying of a voltage through feedback resistor and switch 112 from output terminal 76 to terminal 92 (from which the switching level to comparator/detector 44 is provided) would provide an upwardly curving compensation factor to a characteristic which drooped or curved downwardly when uncompensated.

In connection with the showing of FIG. 2, the feedback resistors have been shown as variable resistors and have been shown connected in circuit by switches. Although two of these circuits having the same effect could be used in combination, in practice, the desired resistance level for a single feedback path would be determined, and a single fixed resistor would be connected permanently to provide the desired compensation. The preferred compensation feedback resistor circuit arrangement is that represented by the resistor 86 connected between terminals 90 and 92.

It is to be understood that the foregoing description and the associated drawings are merely illustrative of specific embodiments of the invention. By way of example and not limitation, it would be possible to use two of the feedback circuits in combination with one another;

separate relaxation oscillator circuits without a common current source may be employed in combination with the reference capacitor and the pressure variable capacitor to generate a direct current voltage which varies with the varying capacitance of the pressure responsive capacitor; and other minor circuit variations may be used. Accordingly, the present invention is not limited to that precisely as shown and described herein.

What is claimed is:

1. A linearized capacitive pressure transducer system comprising:
   a main variable capacitor which has a capacitance which varies with applied pressure;
   a reference capacitor which has a relatively constant capacitance;
   circuit means associated with said variable capacitor for charging said variable capacitor with a predetermined current to a predetermined reference voltage level, and for providing a first timing signal when the predetermined reference voltage level is reached;
   circuit means associated with said reference capacitor for charging said reference capacitor with a predetermined current to a predetermined reference voltage level and providing a second timing signal when the predetermined voltage level is reached;
   a current source;
   switching means for directing current from said current source alternatively to said variable capacitor and to said reference capacitor;
   bistable circuit means responsive to said first and second timing signals to change state and to reverse the state of said switching means to change current flow;
   detection and integrator circuit means for receiving the pulse output from said bistable circuit means and for converting it into a D.C. electrical signal;
   means for amplifying said D.C. electrical signal to provide a system output signal which varies substantially linearly with changes in pressure but which when uncompensated has a substantially continuous curvature producing minor departures from linearity;
   feedback means connected from said system output voltage amplifying means to at least one of said circuit means associated with said capacitors for incrementally varying the time required for charging at least one of said capacitors, to substantially compensate for the curvature of the system output voltage versus pressure characteristic; and
   said feedback means including means for changing the charging current to at least one of said capacitors incrementally as said system output voltage changes.

2. A linearized capacitive pressure transducer system comprising:
   a main variable capacitor which has a capacitance which varies with applied pressure;
   a reference capacitor which has a relatively constant capacitance;
   circuit means associated with said variable capacitor for charging said variable capacitor with a predetermined current to a predetermined reference voltage level, and for providing a first timing signal when the predetermined reference voltage level is reached;
   circuit means associated with said reference capacitor for charging said reference capacitor with a predetermined current to a predetermined reference voltage level and providing a second timing signal when the predetermined voltage level is reached;
   a current source;
   switching means for directing current from said current source alternatively to said variable capacitor and to said reference capacitor;
   bistable circuit means responsive to said first and second timing signals to change state and to reverse the state of said switching means to change current flow;
   detection and integrator circuit means for receiving the pulse output from said bistable circuit means and for converting it into a D.C. electrical signal;
   means for amplifying said D.C. electrical signal to provide a system output signal which varies substantially linearly with changes in pressure but which when uncompensated has a substantially continuous curvature producing minor departures from linearity;
   feedback means connected from said system output voltage amplifying means to at least one of said ciruit means associated with said capacitors for incrementally varying the time required for charging at least one of said capacitors, to substantially compensate for the curvature of the system output voltage versus pressure characteristic; and
   said feedback means including means for changing the reference voltage level to which at least one of said capacitors is charged, incrementally as said system output voltage changes.

3. A linearized capacitive pressure transducer system comprising:
   a main variable capacitor which has a capacitance which varies with applied pressure;
   a reference capacitor which has a relatively constant capacitance;
   circuit means associated with said variable capacitor for charging said variable capacitor with a predetermined current to a predetermined reference voltage level, and for providing a first timing signal when the predetermined reference voltage level is reached;
   circuit means associated with said reference capacitor for charging said reference capacitor with a predetermined current to a predetermined reference voltage level and providing a second timing signal when the predetermined voltage level is reached;
   a current source;
   switching means for directing current from said current source alternatively to said variable capacitor and to said reference capacitor;
   bistable circuit means responsive to said first and second timing signals to change state and to reverse the state of said switching means to change current flow;
   detection and integrator circuit means for receiving the pulse output from said bistable circuit means and for converting it into a D.C. electrical signal;
   means for amplifying said D.C. electrical signal to provide a system output signal which varies substantially linearly with changes in pressure but which when uncompensated has a substantially continuous curvature producing minor departures from linearity;
   feedback means connected from said system output voltage amplifying means to at least one of said circuit means associated with said capacitors for incrementally varying the time required for charging at least one of said capacitors, to substantially compensate for the curvature of the system output voltage versus pressure characteristic; and said feedback circuit means including a purely resistive path.

4. A linearized capacitive pressure transducer system as defined in claim 3 wherein said reference capacitor and said variable capacitor are mounted on the same support, whereby thermal variations are minimized.

5. A linearized capacitive pressure transducer system comprising:

a main variable capacitor which has a capacitance which varies with applied pressure;

a reference capacitor which has a relatively constant capacitance;

circuit means associated with said variable capacitor for charging said variable capacitor with predetermined current to a predetermined reference voltage level, and for providing a first timing signal when the predetermined reference voltage level is reached;

circuit means associated with said reference capacitor for charging said reference capacitor with a predetermined current to a predetermined reference voltage level and providing a second timing signal when the predetermined voltage level is reached;

means responsive to said first and second timing signals for generating a system output voltage which increases substantially linearly with increases in pressure which increases the capacitance of the variable capacitor and the time required for charging the variable capacitor, said system output voltage having minor departures from linearity;

feedback means connected from said system output voltage generating means to at least one of said circuit means for incrementally varying the time required for charging at least one of said capacitors, to correct for curvature of the system output voltage versus pressure characteristic; and said feedback means including means for changing the charging current to at least one of said capacitors incrementally as said system output voltage changes.

6. A linearized capacitive pressure transducer system comprising:

a main variable capacitor which has a capacitance which varies with applied pressure;

a reference capacitor which has a relatively constant capacitance;

circuit means associated with said variable capacitor for charging said variable capacitor with predetermined current to a predetermined reference voltage level, and for providing a first timing signal when the predetermined reference voltage level is reached;

circuit means associated with said reference capacitor for charging said reference capacitor with a predetermined current to a predetermined reference voltage level and providing a second timing signal when the predetermined voltage level is reached;

means responsive to said first and second timing signals for generating a system output voltage which increases substantially linearly with increases in pressure which increases the capacitance of the variable capacitor and the time required for charging the variable capacitor, said system output voltage having minor departures from linearity;

feedback means connected from said system output voltage generating means to at least one of said circuit means for incrementally varying the time required for charging at least one of said capacitors, to correct for curvature of the system output voltage versus pressure characteristic; and said feedback means including means for changing the reference level to which at least one of said capacitors is charged, incrementally as said system output voltage changes.

7. A linearized capacitive pressure transducer system comprising:

a main variable capacitor which has a capacitance which varies with applied pressure;

a reference capacitor which has a substantially constant capacitance or a capacitance which changes by only a relatively small amount with changes in pressure;

capacitor associated circuit means for charging and discharging said variable and said reference capacitors and for providing a variable signal as the capacitance of said variable capacitor changes;

circuit means coupled to said capacitor associated circuit means, for generating an output voltage which varies substantially linearly with changes in pressure, but which when uncompensated has a continuous curvature producing minor departures from linearity;

means for feeding back a portion of the output signal to said capacitor associated circuit to produce an incremental output having a polarity and magnitude to substantially compensate for said minor departures from linearity; and said feedback means includes means for changing the charging current to at least one of said capacitors incrementally as said system output voltage changes.

8. A linearized capacitive pressure transducer system comprising:

a main variable capacitor which has a capacitance which varies with applied pressure;

a reference capacitor which has a substantially constant capacitance or a capacitance which changes by only a relatively small amount with changes in pressure;

capacitor associated circuit means for charging and discharging said variable and said reference capacitors and for providing a variable signal as the capacitance of said variable capacitor changes;

circuit means coupled to said capacitor associated circuit means, for generating an output voltage which varies substantially linearly with changes in pressure, but which when uncompensated has a continuous curvature producing minor departures from linearity;

means for feeding back a portion of the output signal to said capacitor associated circuit to produce an incremental output having a polarity and magnitude to substantially compensate for said minor departures from linearity; and said feedback means including means for changing the reference level to which at least one of said capacitors is charged, incrementally as said system output voltage changes.

9. A linearized capacitive pressure transducer system comprising:

a main variable capacitor which has a capacitance which varies with applied pressure;

a reference capacitor which has a substantially constant capacitance or a capacitance which changes by only a relatively small amount with changes in pressure;

capacitor associated circuit means for charging and discharging said variable and said reference capacitors and for providing a variable signal as the capacitance of said variable capacitor changes;

circuit means coupled to said capacitor associated circuit means, for generating an output voltage which varies substantially linearly with changes in pressure, but which when uncompensated has a continuous curvature producing minor departures from linearity;

means for feeding back a portion of the output signal to said capacitor associated circuit to produce an incremental output having a polarity and magnitude to substantially compensate for said minor departures from linearity; and said feedback circuit means including a purely resistive path.

10. A linearized capacitive pressure transducer system as defined in claim 9 wherein said reference capacitor and said variable capacitor are mounted on the same support, whereby thermal variations are minimized.

* * * * *